United States Patent
He

(10) Patent No.: US 9,685,386 B2
(45) Date of Patent: Jun. 20, 2017

(54) SEMICONDUCTOR TEST STRUCTURE FOR MOSFET NOISE TESTING

(71) Applicant: CSMC TECHNOLOGIES FAB1 CO., LTD., Jiangsu (CN)

(72) Inventor: Xiaodong He, Jiangsu (CN)

(73) Assignee: CSME TECHNOLOGIES FAB1 CO., LTD., Jiangsu (CN)

( * ) Notice: Subject to any disclaimer, the term of this patent is extended or adjusted under 35 U.S.C. 154(b) by 123 days.

(21) Appl. No.: 14/403,565

(22) PCT Filed: Sep. 4, 2013

(86) PCT No.: PCT/CN2013/082910
§ 371 (c)(1),
(2) Date: Nov. 24, 2014

(87) PCT Pub. No.: WO2014/063533
PCT Pub. Date: May 1, 2014

(65) Prior Publication Data
US 2015/0221568 A1    Aug. 6, 2015

(30) Foreign Application Priority Data

Oct. 23, 2012  (CN) .......................... 2012 1 0406422

(51) Int. Cl.
H01L 23/552 (2006.01)
H01L 21/66 (2006.01)
(Continued)

(52) U.S. Cl.
CPC .......... H01L 22/34 (2013.01); H01L 23/5225 (2013.01); H01L 23/552 (2013.01);
(Continued)

(58) Field of Classification Search
CPC ... H01L 22/34; H01L 23/5225; H01L 23/522; H01L 23/5226; H01L 29/78
(Continued)

(56) References Cited

U.S. PATENT DOCUMENTS

2007/0057280 A1    3/2007  Hayashi et al.
2009/0243052 A1    10/2009 Chien
(Continued)

FOREIGN PATENT DOCUMENTS

| CN | 1428863 A | 7/2003 |
|----|-----------|--------|
| CN | 102224588 | 10/2011 |
| JP | 2004-241577 | 8/2004 |

OTHER PUBLICATIONS

Office Action, dated Dec. 29, 2015, issued in Chinese Patent Application No. 201210406422.X, 6 pages.
(Continued)

Primary Examiner — Eliseo Ramos Feliciano
Assistant Examiner — Joannie A Garcia
(74) Attorney, Agent, or Firm — Nixon Peabody, LLP; Khaled Shami

(57) ABSTRACT

The present invention provides a semiconductor test structure for MOSFET noise testing. The semiconductor test structure includes: a MOSFET device having a first conductivity type formed on a first well region of a semiconductor substrate; a metal shielding layer formed on the MOSFET device, the metal shielding layer completely covering the MOSFET device and extending beyond the circumference of the first well region; a deep well region having a second conductivity type formed in the semiconductor substrate close to the bottom surface of the first well region, the deep well region extending beyond the circumference of the first well region; wherein a vertical via is formed between the portion of the metal shielding layer extending beyond the
(Continued)

first well region and the portion of the deep well region extending beyond the first well region to couple the metal shielding layer to the deep well region. The metal shielding layer is used to be connected to the ground terminal of a testing machine during testing, and the first conductivity type and the second conductivity type are opposite conductivity types.

11 Claims, 1 Drawing Sheet

(51) Int. Cl.
  *H01L 29/78*  (2006.01)
  *H01L 23/522*  (2006.01)
(52) U.S. Cl.
  CPC .......... *H01L 29/78* (2013.01); *H01L 23/5226* (2013.01); *H01L 2924/0002* (2013.01)
(58) Field of Classification Search
  USPC ....... 257/131, 156, 288, 350, 376, 409, 508, 257/610, E21.137, E21.531, E21.435, 257/E27.099, E29.263
  See application file for complete search history.

(56) References Cited

U.S. PATENT DOCUMENTS

| 2011/0127602 A1* | 6/2011 | Mallikarjunaswamy | H01L 21/823807 257/331 |
| 2012/0175727 A1* | 7/2012 | Lin | H01L 21/743 257/508 |

OTHER PUBLICATIONS

International Search Report mailed Dec. 12, 2013 in International Application No. PCT/CN2013/082910 in Chinese with English translation, 5 pgs total.

* cited by examiner

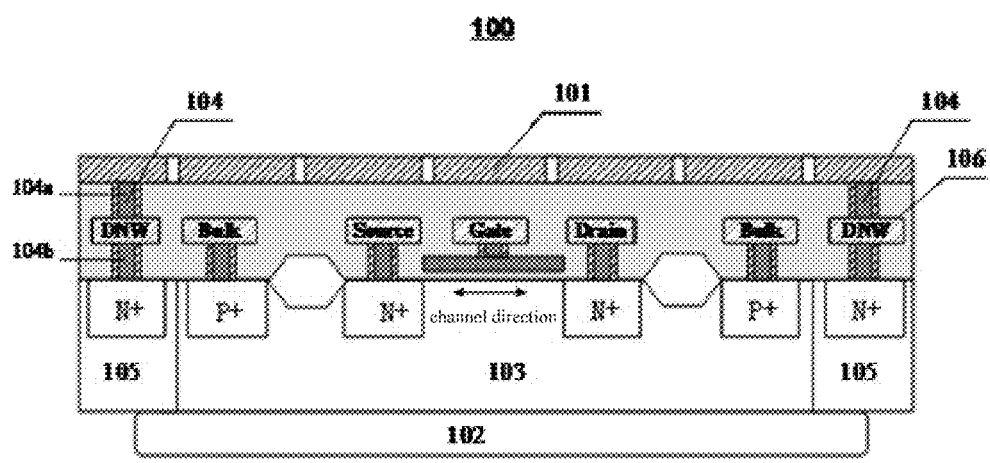

SEMICONDUCTOR TEST STRUCTURE FOR MOSFET NOISE TESTING

PRIORITY CLAIM

The present application is a National Stage Application of International Application No. PCT/CN2013/082910 entitled "Semiconductor Test Structure For Mosfet Noise Testing" filed Sep. 4, 2013, which claims priority to Chinese Patent Application No. CN 201210406422.X filed Oct. 23, 2012, the contents of which are incorporated herein by reference in their entirety.

FIELD OF THE INVENTION

The present disclosure relates to a field of MOSFET (Metal-Oxide-Semiconductor Field-Effect Transistor), and more particularly relates to a semiconductor test structure for MOSFET noise testing.

BACKGROUND OF THE INVENTION

MOSFET is a common semiconductor device. Currently as the performance of MOSFET devices is gradually increased, more and more integrated circuits may be implemented by using MOSFET, in addition to the traditional digital signal processing such as microprocessor, microcontroller, etc. However, regardless of which application situations, the noise of the MOSFET device will bring a lot of manufacture inconvenience and deterioration to the performance.

The noise of the MOSFET mainly have three types: (1) channel thermal noise, which is derived from the channel resistance, and involves the working state and the temperature, but is independent of frequency (white noise); (2) induced gate noise, which is derived from the channel thermal noise, and it is coupled to the gate through the gate capacitive, such that the gate voltage varies along with the change of channel potential distribution (thermal noise), i.e. gate noise induced by channel thermal noise; (3) 1/f noise, which is mainly derived from the interface state of Si—$SiO_2$ interface (because it sometimes traps, and sometimes releases the carriers in the channel, and thus making channel currents go up and down). It is a low-frequency noise with a noise voltage that falls off steadily into the higher frequencies, which is why it is called 1/f noise.

In order to ensure product quality, the MOSFET devices typically require noise testing. However, wafer level device noise test requires a very high measuring accuracy of the equipment and test environmental requirements. Any slight noise will cause unstable or erroneous test results, thus providing inaccurate information for the circuit designers. A conventional test protocol is to establish an expensive shield space to reduce noise, but it cannot be completely isolate the device from outside interference.

Therefore, a test structure with low cost and ease of operation, which can be used to test the real noise of the MOSFET device without interference of the outside noise, is still of a great demand.

SUMMARY OF THE INVENTION

Accordingly, the present disclosure is directed to a semiconductor test structure for MOSFET noise testing. The semiconductor test structure includes: a MOSFET device having a first conductivity type formed on a first well region of a semiconductor substrate; a metal shielding layer formed on the MOSFET device, the metal shielding layer completely covering the MOSFET device and extending beyond the circumference of the first well region; a deep well region having a second conductivity type formed in the semiconductor substrate close to the bottom surface of the first well region, the deep well region extending beyond the circumference of the first well region; wherein a vertical via is formed between the portion of the metal shielding layer extending beyond the first well region and the portion of the deep well region extending beyond the first well region to couple the metal shielding layer to the deep well region. The metal shielding layer is configured to be connected to the ground terminal of a testing machine during testing, and the first conductivity type and the second conductivity type are opposite conductivity types.

In some embodiments of the present disclosure, the semiconductor test structure further includes a second well region formed in the semiconductor substrate close to the circumference of the first well region, wherein the second well region is at least partially in contact with the deep well region, and the vertical via is formed between the second well region and the portion of the metal shielding layer extending beyond the first well region.

In some embodiments of the present disclosure, the MOSFET device comprises a first metal layer, and at least one of a source electrode, a drain electrode, and a gate electrode is formed in the first metal layer.

In some embodiments of the present disclosure, the MOSFET device further comprises a base electrode formed in the first metal layer.

In some embodiments of the present disclosure, the metal shielding layer is a second metal layer formed in the first metal layer by patterning.

In some embodiments of the present disclosure, the first metal layer and the second metal layer are formed an interlayer dielectric layer therebetween, and the first metal layer and the semiconductor substrate are formed a pre-metal dielectric layer therebetween.

In some embodiments of the present disclosure, the vertical via comprises a first partial vertical via extending through the interlayer dielectric layer and a second partial vertical via extending through the pre-metal dielectric layer; and the first partial vertical via and the second partial vertical via form an extraction electrode therebetween in the first metal layer.

In some embodiments of the present disclosure, the metal shielding layer horizontally defines at least one groove extending in a direction perpendicular to a channel direction of the MOSFET device.

In some embodiments of the present disclosure, the first conductivity type is N-type and the second conductivity type is P-type.

BRIEF DESCRIPTION OF THE DRAWINGS

The present disclosure is described in detail in conjunction with simplified accompanying figures.

FIG. 1 is a cross-sectional view of a semiconductor test structure for MOSFET noise testing according to one embodiment of the present invention.

DETAILED DESCRIPTION OF THE EMBODIMENTS

Reference will now be made to the drawings to describe, in detail, embodiments of the present disclosure. It should be noted that the components in the drawings are not necessarily drawn to scale, the emphasis instead being placed upon clearly illustrating the principles of the present disclosure.

FIG. 1 is a cross-sectional view of a semiconductor test structure for a MOSFET noise testing according to one embodiment of the present invention.

In the illustrated embodiment of FIG. 1, a semiconductor test structure 100 has a first well region 103, which has a first conductivity type and is formed in a semiconductor substrate. A MOSFET device can be formed on the first well region 103. The first well region 103 can be a p-type well region as shown in FIG. 1, but it can also be N-type. A typical structure of the MOSFET device, which is shown in FIG. 1, includes a source electrode, a drain electrode, and a gate electrode, as well as an optional base electrode. It is to be understood that, the MOSFET device formed on the first well region 103 can be any existing or under developed MOSFET devices.

A metal shielding layer 101 is formed on the MOSFET device, and it completely covers the MOSFET device and extends beyond the circumference of the first well region 103. FIG. 1 also shows a cross-section view along a channel direction, it should be understood that, the metal shielding layer 101 actually also extends beyond the circumference of the first well region 103 in a horizontal direction perpendicular to a channel direction. In addition, a deep well region 102 is formed in the semiconductor substrate close to the bottom surface of the first well region 103, and the deep well region 102 also extends beyond the circumference of the first well region 103. In the test structure provided by the present invention, the deep well region 102 may have the opposite conductivity type to that of the first well region 103, for example, it can be deep N-well (DNW) as illustrated in FIG. 1.

Furthermore, a vertical via 104 is formed between the portion of the metal shielding layer 101 extending beyond the first well region and the portion of the deep well region 102 extending beyond the first well region, such that the metal shielding layer 101 is coupled to the deep well region 102. As many as possible vertical vias 104 can be formed to fully encompass the whole MOSFET device. As described above, since the metal shielding layer 101 and the deep well region 102 extend beyond the circumference of the first well region 103, it can be inferred that the vertical vias 104 formed therebetween surround the first well region 103 and the MOSFET device formed thereon. FIG. 1 is a cross-sectional view along the channel direction. During the noise test of the MOSFET, the metal shielding layer 101 can be connected to a ground terminal of a testing machine, and the source, the drain, the gate, and the base can be connected to the corresponding interfaces of the test machine, respectively. Accordingly, a device-level shield structure is formed by the metal shielding layer 101, the deep well region 102, and the vertical via 104 coupled between them. This three-dimensional structure can completely isolate the MOSFET device from the interference of the outside noise, resulting in that a real noise of the device can be obtained during the test.

In the illustrated embodiment shown in FIG. 1, a second well region 105 is formed in the semiconductor substrate close to the circumference of the first well region 103. Referring to FIG. 1, the second well region 105 is at least partially in contact with the deep well region 102, especially at the both sides of the first well region 103. In that case, the vertical via 104 will be formed between the portion of the metal shielding layer 101 extending beyond the first well region 103 and the second well region 105.

Referring to FIG. 1, the source electrode, the drain electrode, the gate electrode, and the base electrode of the MOSFET device can substantially formed in the same first metal layer, and the metal shielding layer 101 can be a second metal layer formed in the first metal layer. It should be understood that, there can be more metal layers in the semiconductor testing structure of the present invention.

Normally, an interlayer dielectric layer can be formed between the first metal layer and the second metal layer, and a pre-metal dielectric layer can be formed between the first metal layer and the semiconductor substrate. In that case, the vertical via includes a first partial vertical via 104a extending through the interlayer dielectric layer and a second partial vertical via 104b extending through the pre-metal dielectric layer. An extraction electrode 106 of the second well region, which is formed in the first metal layer, can be provided between the first partial vertical via and the second partial vertical via.

Moreover, the metal shielding layer 101 shown in FIG. 1 horizontally defines a groove extending in a direction perpendicular to the channel direction. The groove can be configured according to the actually required area of the metal shielding layer. For example, if the area of the metal shielding layer is too small, the groove is not necessary; if the area of the metal shielding layer is very large, one or more groove can be formed according to the design rules.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A semiconductor test structure for MOSFET noise testing, comprising:
   a semiconductor substrate comprising a first well region having a circumference and a first conductivity type;
   a MOSFET device formed on the first well region, the MOSFET device having source, drain and gate electrodes;
   a metal shielding layer formed on the MOSFET device, the metal shielding layer being electrically isolated from the source, drain and gate electrodes of the MOSFET device and completely covering the MOSFET device and extending beyond the circumference of the first well region; and
   a deep well region formed in the semiconductor substrate at a bottom surface of the first well region opposite the MOSFET device, the deep well region having a second conductivity type and extending beyond the circumference of the first well region;
   wherein a vertical via is formed between a portion of the metal shielding layer extending beyond the first well region and a portion of the deep well region extending beyond the first well region, such that the metal shielding layer is coupled to the deep well region;
   the metal shielding layer is configured to be connected to a ground terminal of a testing machine during testing, and the first conductivity type and the second conductivity type are opposite conductivity types.

2. The semiconductor test structure according to claim 1, further comprising a second well region formed in the semiconductor substrate proximately to the circumference of the first well region, wherein the second well region is at least partially in contact with the deep well region, and the vertical via is formed between the second well region and the portion of the metal shielding layer extending beyond the first well region.

3. The semiconductor test structure according to claim 2, wherein the MOSFET device comprises a first metal layer, and at least one of the source electrode, a drain electrode, and a gate electrode is formed in the first metal layer.

4. The semiconductor test structure according to claim 3, wherein the MOSFET device further comprises a base electrode formed in the first metal layer.

5. The semiconductor test structure according to claim 3, wherein the metal shielding layer is a second metal layer formed in the first metal layer by patterning.

6. The semiconductor test structure according to claim 5, wherein the first metal layer and the second metal layer are separated by an interlayer dielectric layer therebetween, and the first metal layer and the semiconductor substrate are separated by a pre-metal dielectric layer therebetween.

7. The semiconductor test structure according to claim 6, wherein the vertical via comprises a first partial vertical via extending through the interlayer dielectric layer and a second partial vertical via extending through the pre-metal dielectric layer; and the first partial vertical via and the second partial vertical via form an extraction electrode therebetween in the first metal layer.

8. The semiconductor test structure according to claim 1, wherein the metal shielding layer horizontally defines at least one groove extending in a direction perpendicular to a channel direction of the MOSFET device.

9. The semiconductor test structure according to claim 1, wherein the first conductivity type is N-type and the second conductivity type is P-type.

10. The semiconductor test structure according to claim 2, wherein the metal shielding layer horizontally defines at least one groove extending in a direction perpendicular to a channel direction of the MOSFET device.

11. The semiconductor test structure according to claim 2, wherein the first conductivity type is N-type and the second conductivity type is P-type.

* * * * *